United States Patent
Farr et al.

(10) Patent No.: US 9,494,629 B2
(45) Date of Patent: Nov. 15, 2016

(54) PROCESS AND APPARATUS FOR CAPACITIVE SEAT OCCUPANT SENSING FOR MOTOR VEHICLES

(71) Applicant: I.G. BAUERHIN GMBH, Gruendau (DE)

(72) Inventors: Axel Farr, Waechtersbach (DE); Jochen Michelmann, Gelnhausen (DE)

(73) Assignee: I.G. BAUERHIN GMBH, Gruendau (DE)

( * ) Notice: Subject to any disclaimer, the term of this patent is extended or adjusted under 35 U.S.C. 154(b) by 545 days.

(21) Appl. No.: 14/132,171

(22) Filed: Dec. 18, 2013

(65) Prior Publication Data

US 2015/0168469 A1 Jun. 18, 2015

(30) Foreign Application Priority Data

Dec. 20, 2012 (DE) .................. 10 2012 025 037

(51) Int. Cl.
*B60R 21/015* (2006.01)
*G01R 27/26* (2006.01)
*B60N 2/00* (2006.01)
*B60N 2/56* (2006.01)

(52) U.S. Cl.
CPC ........... *G01R 27/2605* (2013.01); *B60N 2/002* (2013.01); *B60N 2/5685* (2013.01); *B60R 21/01532* (2014.10)

(58) Field of Classification Search
CPC .............. G01R 27/2605; G01R 31/26; G01R 31/2642; G01R 31/2648; G01R 31/2831; G01R 31/31702; G01R 31/016; G01R 31/028; B60R 21/01532; B60N 2/5685; B60N 2/002
See application file for complete search history.

(56) References Cited

U.S. PATENT DOCUMENTS 3,943,376 A * 3/1976 Long ................. B60R 22/48
307/116
2013/0334196 A1* 12/2013 Lamesch ............. B60N 2/5685
219/217

FOREIGN PATENT DOCUMENTS

LU       EP 2161165 A1 * 3/2010 ............. B60N 2/002

* cited by examiner

*Primary Examiner* — Julian Huffman
*Assistant Examiner* — Michael Konczal
(74) *Attorney, Agent, or Firm* — Karl F. Milde; Eckert Seamans Cherin & Mellott, LLC

(57) ABSTRACT

The invention relates to a method and an apparatus for capacitive seat-occupancy recognition for vehicle seats. The apparatus which is based on the method comprises a reference capacitor that possesses a capacitance with respect to a first reference potential of a vehicle, an electrode integrated into a seat sensor that possess a capacitance with respect to a first reference potential, an at least parasitically-present capacitance of the sensor electrode with respect to a second reference potential or the vehicle ground, a first switch that connects the reference capacitor and a reference-voltage source of known voltage connected with the reference potential, a second switch that connects the sensor electrode with reference capacitor, and a third switch that connects the sensor electrode with the reference potential and the at least parasitically-present capacitance with the vehicle ground.

16 Claims, 9 Drawing Sheets

PROCESS AND APPARATUS FOR CAPACITIVE SEAT OCCUPANT SENSING FOR MOTOR VEHICLES

BACKGROUND OF THE INVENTION

The invention relates to a method and an arrangement for capacitive seat-occupancy recognition for vehicle seats.

In connection with pertinent vehicle components, such methods and arrangements serve to recognize the occupancy of a vehicle seat by a person, and moreover to undertake classification regarding what type of seat occupancy exists. It must be possible to distinguish whether an object, for example a shopping handbasket, a purse, or similar is located on the seat, whether a child seat (empty or occupied by a child) is located on the seat, or whether an adult is seated.

It is additionally advantageous if the method employed can provide information regarding the seating position of the passenger along with personal classification. Such information would provide data regarding whether the passenger has sat on the seat and has established contact between his/her upper body with the seat back, or whether the passenger has bent far forward and contact with the seat back is not resulting, or no longer exists.

Known systems for seat-occupancy recognition as a rule comprise a sensor system that acquires data at one or at several locations of the seat, plus an electronic evaluation circuit that calculates or derives a classification of the seat occupancy.

Various types of sensors may be used for the acquisition system such as resistive, capacitive, or inductive sensors that alter an electrical measurement signal depending on seat occupancy. These alterations are evaluated by an electronic evaluation circuit, and are assigned to various seat-occupancy statuses. Only resistive and dielectric systems enjoy wide use.

While resistive systems are generally preferred when low expenditures and low costs are important, dielectric systems are preferred when positive recognition of persons and distinction between persons and objects of similar weight and/or similar surface pressure on the seat base, are required.

Such dielectric systems as a rule consist of a defined arrangement of one or several electrodes and a device to apply a defined alternating voltage or pulsed voltage to this arrangement and also be able to acquire the current taken by the system and evaluate it, and from this evaluation to be capable of making a decision regarding the seat occupancy.

These arrangements require on the one hand very specialized circuitry techniques in order both to define the voltage exactly and to measure the current as precisely as possible so that the relatively small dielectric alterations caused by a passenger in the sensor arrangement may be appropriately detected. On the other hand, there is also the requirement with such dielectric systems that the sensors react to water on the seat base or in the sensor arrangement similarly as to the presence of a person, which increases the expense of detection and evaluation significantly if a positive distinction must be made between a signal alteration caused by person or water.

DE 10 2009 050 437 A1 describes a device to detect a close object that is used, for example, to determine the occupancy of a vehicle seat in order to require the person to fasten the seat belt. The device comprises an electrode arrangement that includes at least two stationary electrodes permanently affixed opposite to each other, a source of alternating current to supply the electrode arrangement, and a measurement and evaluation unit to measure the current flowing because of the capacitance caused by the electrodes. The electrodes possess electrode surfaces facing toward the object to be detected, and are at a mutual separation such that the approach of an object into the immediate area of influence of the electrode arrangement leads to a reduction of the measured current that is detected and reported by the measurement and evaluation unit within the parameters defining the presence of an object.

US 2008/0208414 A1 (corresponds to priority document DE 10 2004 047 906 A1) describes a control device to trigger a vehicle passenger-protective device such as an airbag or belt tensioner. This control device comprises a force sensor in the form of a capacitive sensor to receive a force moment acting on the vehicle seat, and a control and evaluation circuit that produces a classification in particular one regarding weight from the sensor signals, and independent of this initiates the safety device for the occupant. The measurement capacitor of the capacitive sensor is deformable by the inertial forces acting on the vehicle so that it changes its capacitance. This revised capacitance is evaluated, and a triggering signal for the safety device is derived.

DE 196 30 769 A1 describes a device and a method to determine the entry of a person into a vehicle and/or position(s) of person(s) within a vehicle. Two metallic, conducting surfaces or wires electrically isolated from each other that are shaped as the electrodes of one or several plate capacitors are used. These plate capacitors are positioned within the vehicle such that a person entering the vehicle completely or partially passes between these plates. The plate capacitors are frequency-determining elements of a first narrow-band electronic circuit.

SUMMARY OF THE INVENTION

It is therefore the objective of the present invention to provide a method for capacitive seat-occupancy recognition that avoids at least a portion of the above-described disadvantages of Prior Art. Further, an arrangement is to be provided that is suited to perform the procedure.

This task is achieved by a method and apparatus that allows for the installation of seat heating that is present in many vehicle seats and one or more sensors in a common mat, which are capable of both triggering the heating of vehicle seats and performing the procedure for capacitive seat-occupancy recognition. Through the implementation of the method it is entirely possible to distinguish between water in the seat and a person in the seat.

Based on the method per the invention, capacitive seat-occupancy recognition is performed that is based on $C_{REF}$, $C_X$ and $C_Y$, whereby $C_{REF}$ is the known capacitance of a reference capacitor with respect to a first reference potential of a vehicle, $C_X$ is the capacitance of a sensor electrode integrated into a seat, preferably into a seat base with respect to the first reference potential, and $C_Y$ is the at least parasitically present capacitance of the sensor electrode with respect to a second reference potential of a vehicle or the vehicle ground itself.

Further, reference will be made to a first switch connecting the reference capacitor and a reference-voltage source connected with the reference potential of known voltage $U_{REF}$, to a second switch connecting the sensor electrode to the reference capacitor, and to a third switch connecting the sensor electrode with the reference potential and the at least parasitically present capacitance with the vehicle ground.

In order to detect the momentary seat-occupancy status of the seat, the following steps are performed at least once:

Step a1: Charging of the reference capacitor $C_{Ref}$ to the voltage $U_{Ref}$ of the reference-voltage source by opening the second switch and closing the first switch and discharging of capacitors $C_X$ and $C_Y$ by closing the third switch, Step b1: Opening of the first switch and of the third switch to create an oscillation in which the capacitor $C_{REF}$ and the capacitors $C_X$ and $C_Y$ retain their charge, Step c1: Closing of the second switch, so that the charge of the reference capacitors $C_{REF}$ is distributed to the capacitors $C_{REF}$, $C_X$ and $C_Y$, and a first resulting voltage $U_{RES}$, whereby $$U_{RES} = U_{REF} \cdot \frac{C_{REF}}{C_{REF} + C_X + C_Y}$$

applies, is set and stored.

Step d1: Comparison of the resulting voltage $U_{RES}$ with stored limit values that are assigned to specific occupancy or seat statuses, and, the bestimmten occupancy Step e1: Derivation of an occupancy- and/or seat status from the comparison.

It must be noted that an essentially temporally-immutable differential voltage to the vehicle ground is involved with the first and any possible second reference voltage for the duration of the performance of the above-mentioned Steps.

The arrangement for capacitive seat-occupancy recognition comprises a reference capacitor with capacitance of $C_{REF}$ with respect to the first reference potential of a vehicle, a sensor electrode integrated into the seat base that possesses a capacitance $C_X$ with respect to a first reference potential, an at least parasitic capacitance on the sensor electrode with respect to a second reference potential or the vehicle ground, a first switch connecting the reference capacitor and a reference-voltage source connected with the reference potential of known voltage $U_{REF}$, to a second switch connecting the sensor electrode to the reference capacitor, and to a third switch connecting the sensor electrode with the reference potential and the at least parasitically present capacitance with the vehicle ground.

The capacitive seat-occupancy recognition based on the invention is based on the fact that the human body possesses a significantly higher permittivity with respect to the environment that is expressed as a dielectric index $\gg 1$. Among other things, the physical effect is used that a person, or part of a person, within an electrical field influences it, and this alteration is used for detection purposes, i.e., seat-occupancy recognition. When the presence of a person to be detected influences the electrical field of a sensor electrode with respect to its environment it causes a significant increase in the technical measurement of capacitance of this sensor electrode. Disadvantageous is the fact that this increase of simultaneous or independent variation of at least one parasitically present capacitance $C_Y$ is not only supported, but can also be hidden or faked. Such a variation may result from water in a seat, for example.

The method based on the invention and the device based on the invention possess the advantage that, with very few additional passive components, wide-ranging information may be obtained regarding the type of seat occupancy.

In another embodiment example of the method, it is also based on a fourth switch that connects the connection point of the reference capacitor CREF to the first switch and the second switch with the first reference potential, and to a fifth switch that connects the connection point of the sensor electrode $C_X$ to the second switch and the third switch and the at least parasitic capacitance $C_Y$ of the sensor electrode with the reference-voltage source $U_{REF}$. The procedure performs a Step a2.0 before Step a1 in which the fourth switch and the fifth switch are always open in their initial setting. In a Step c2.1, which is performed after Step c1, the second switch is opened again, and then the reference capacitor $C_{REF}$ is discharged to the first reference potential by the closing of the fourth switch, and the fifth switch is closed in order to charge the capacitors $C_X$ and $C_Y$ to the reference voltage $U_{REF}$ of the reference-voltage source.

After the previously-described Step c2.1, a Step c2.2 is performed in which the fourth switch and the fifth switch are opened so that an oscillation condition exists in which the capacitance $C_{REF}$ and the capacitors $C_X$ and $C_Y$ retain their charge.

A Step c2.3 follows in which the second switch is closed so that the charge of the capacitors $C_X$ and $C_Y$ is distributed to the capacitors $C_{REF}$, $C_X$ and $C_Y$ and a second resulting voltage $U'_{RES}$ is set. For the resulting voltage $U'_{RES}$, $$U'_{RES} = U_{REF} \cdot \frac{C_X + C_Y}{C_{REF} + C_X + C_Y}$$

applies.

After Step d1 has been performed, a Step d2 follows in which also the second resulting voltage $U'_{RES}$ and/or the differential between both resulting voltages $U_{RES}$ and $U'_{RES}$ with stored limit values assigned to specific occupancy or seat statuses are compared.

Then follows Step e1 and then a Step f2 after Step e1 in which the differential between the reference voltage $U_{RES}$ and the sum of the resulting voltages $U_{RES}$ and $U'_{RES}$ is compared with the stored values in order to recognize any charge loss arising during the performed test, and thus to validate or discard or alter the result of the derivation of the occupancy status from the comparison in Step e1.

The advantage of this arrangement consists of the fact that it is possible in this manner to obtain an evaluation regarding the functionality of the method. If a portion of the charge provided in the course of detection is lost because of a defective isolation of the sensor electrodes, then this charge loss will always have the proper direction during all sampling steps so that the sum of both voltages $U_{RES} + U'_{RES}$ result in a value clearly deviating from $U_{REF}$. On the other hand, however, the differential $U_{RES} - U'_{RES}$ always remains relatively unaffected by a rising current leakage even if a slight but tolerable charge loss arises.

In an alternative expansion of the method, capacitive seat-occupancy recognition is based on a thermal conductor that is a component of the seat heater of a seat, for which purpose one end of the thermal conductor is connected to a sixth switch with operating-voltage source $U_B$, which in turn is connected with the vehicle ground, and the other end is connected to a seventh switch with the vehicle ground. Since the sensor electrode with capacitance $C_X$ now divides the seat base with the thermal-conductor layout, it is easy to understand that the at least parasitic capacitance $C_Y$ in this arrangement is overridingly coupled to the thermal-conductor layout so that, for this method, the at least parasitic capacitance $C_Y$ between the connection point of the sensor electrode with the second switch and with the third switch on the one side, and on the other side with the thermal conductor, is taken into account. The connection point with the thermal conductor may be placed at any location of the thermal conductor. It is also possible to provide the connection point at the location where the thermal conductor is connected with the sixth switch. Closing of the sixth and seventh switch connects the thermal conductor to the battery voltage with the open eighth switch and the open ninth switch of the thermal conductor, thus producing heat to warm the seat.

Further, the method is based on an at least parasitic external capacitance $C_{EXT}$, that on the one side is connected to the first reference potential or to the vehicle ground and on the other side with the thermal conductor (the connection may be any location of the thermal-conductor layout, for example a connection point). This connection point is connected via an eighth switch with a second reference-voltage source $U^*_{REF}$, preferably selected as $$U^*_{REF} = U_{REF} \cdot \frac{C_X}{C_{REF} + C_X},$$

whereby the case of the unoccupied, dry seat is assumed for $C_X$, which for its part is connected with the first reference potential or the vehicle ground, and furthermore, this connection point is connected via a ninth switch with the reference potential of the reference-voltage source $U^*_{REF}$.

Under these pre-conditions, a Step a3.0 is performed before Step a1 in which the sixth switch and the seventh switch are opened in order to render the thermal conductor potential free, and then a Step a3.1 is performed after Step a1 in which closing of the ninth switch (S9) causes discharge of the at least parasitic capacitance $C_{EXT}$, a Step c3.1 is performed after Step c1 in which the reference capacitor $C_{REF}$ is charged to the voltage $U^*_{REF}$ of the second reference-voltage source by opening the second switch and closing the first switch, and the capacitors $C_X$ and $C_Y$ are discharged by closing the third switch. The ninth switch remains closed, which ensures that the at least parasitically-present capacitance $C_{EXT}$ remains discharged.

Then follows:

a Step c3.2, in which, by opening the first switch and the third switch and by opening the ninth switch, a state of oscillation is created in which the capacitors $C_{REF}$, $C_X$, $C_Y$ and the parasitically present external capacitance $C_{EXT}$ retain their charge, a Step c3.3 in which, through closure of the second switch and simultaneous closing of the eighth switch, the charge of the reference capacitors is distributed to the capacitors $C_{REF}$ and simultaneously the voltage $U^*_{REF}$ is present at the connection between the capacitors $C_Y$ and $C_{EXT}$ and the eighth switch, which achieves the fact that the voltage increase at the parasitically present coupling capacitance turns out to be smaller than in Step c1, whereby approximately $$U^*_{RES} = U_{REF} \cdot \frac{C_{REF}}{C_{REF} + C_X + A \cdot C_Y},$$

with A<1, applies for the resulting voltage $U^*_{RES}$.

The resulting voltage $U^*_{RES}$ is stored.

The value A is a factor dependent on the voltage of the second reference-voltage source $U^*_{REF}$ and the occupancy status of the seat, whereby A is almost zero via the selected magnitude of the second reference-voltage source $U^*_{REF}$ in the case of an unoccupied seat, and is not greater than 1 in the case of an occupied seat. The at least parasitically-present capacitance $C_Y$ in this embodiment example is "con-cealed" to a certain extent by means of the selected method and its parameterization for the case of the unoccupied seat, and appears only for the case of an occupied seat with clearly greater value for $C_X$.

Finally, a decision is made regarding the seat status from the comparison in Step d1 and the derivation from Step e1, and by means of a comparison of $U^*_{RES}$ with stored limit values, a specific occupancy status is assigned to the determined values for $U_{RES}$ and $U^*_{RES}$.

If the lower stored limit values are violated and/or upon overriding alteration of the second resulting voltage $U^*_{RES}$ and only weak alteration (i.e., somewhat less than half as strong), and/or no lower violation of the first voltage $U_{RES}$, it is decided that the seat is occupied.

For a common alteration up to a defined degree (i.e., about the same strength) and/or an identically-oriented rise or drop of both resulting voltages $U_{RES}$ and $U^*_{RES}$, a decision is made that there has been a drift of reference capacitance $C_{REF}$ or of the reference voltage $U_{REF}$ without alteration of the occupancy status of the seat, and it is checked whether the stored limit values are to be altered to new limit values.

For a violation of the upper limit values and/or overriding of the first resulting voltage $U_{RES}$ and of a weak (i.e., somewhat less than half as strong) alteration and/or no violation of the stored limit values of the second voltage, a decision is reached that an unoccupied seat is, however, damp.

In another embodiment example of the method, it is based on a fourth switch that connects the connection point from the reference capacitor $C_{REF}$ to the first switch and to the second switch with the first reference potential, and to a fifth switch that connects the connection point between the sensor electrode $C_X$, the second switch, and the third switch and the at least parasitically-present capacitance $C_Y$ of the sensor electrode with the reference-voltage source $U_{REF}$, and to a thermal conductor that is a component of a seat heater of the seat, for which purpose one end of the thermal conductor, however, is connected via a sixth switch to an operating-voltage source $U_B$, which for its part is connected to the vehicle ground, and at its other end to the vehicle ground via a seventh switch. Since the sensor electrode that possesses the capacitance $C_X$ is now arranged with the thermal conductor in the seat base, it is easy to understand that the parasitic capacitance $C_Y$ in this arrangement is coupled overridingly to the thermal-conductor layout so that for this method, the at least parasitically-present capacitance $C_Y$ between the connection point of the sensor electrode with the second switch, with the third switch and with the fifth switch on the one side and on the other side with the thermal conductor is taken into account. The connection point with the thermal conductor may be at any location of the thermal conductor. It is possible, however, to provide the connection point at the location where the thermal conductor is connected with the sixth switch. By closing the sixth switch and the seventh switch with an open eighth switch and an open ninth switch, the thermal conductor is connected to battery voltage, thereby producing seat heating.

Further, the method is based on an at least parasitic external capacitance $C_{EXT}$, that on the one side is connected to the first reference potential or to the vehicle ground and on the other side with the thermal conductor (the connection may be any location of the thermal-conductor layout, for example a connection point). This connection point is via an eighth switch with a second reference-voltage source $U^*_{REF}$, that for its part is connected to the first reference potential or the vehicle ground, and furthermore this connection point is connected via a ninth switch with the reference potential of the reference-voltage source U*$_{REF}$.

Under these pre-conditions, a Step a3.0 and a2.0 is performed before Step a1 in which the fourth switch, the fifth switch, the sixth switch, and the seventh switch are opened, then Step a3.1 is performed after Step a1 in order to discharge the at least parasitic capacitance $C_{EXT}$ to discharge by closing of the ninth switch, subsequently the Steps c2.1, c2.2, c2.3, c3.1, c3.2 and c3.3, as described above, are performed, then a Step c4.1 is performed in which the second switch is opened again and subsequently the reference capacitor is discharged to the first reference potential by closing of the fourth switch. By closing of the fifth switch and of the eighth switch, the capacitance $C_X$ is charged up to the reference voltage $U_{REF}$ of the reference-voltage source, and the at least parasitically-present capacitance $C_Y$ is charged up to voltage differential $U_{REF}$–U*$_{REF}$, whereby the voltage U*$_{REF}$ preferably comprises the identical value as the first reference-voltage source.

Then follows a Step c4.2 in which the fourth switch, the fifth switch and the eighth switch are opened so that an oscillation condition exists in which the capacitors $C_{REF}$, $C_X$ and $C_Y$ retain their charge.

Subsequently, a Step c4.3 is performed in which the second switch is closed so that the charge of the capacitance $C_X$ and $C_Y$ is distributed to the capacitors $C_{REF}$, $C_X$ and $C_Y$ and a resulting voltage U$_{RES}$ arises, whereby $$U_{RES}^{} = U_{REF} \cdot \frac{C_X + A \cdot C_Y}{C_{REF} + C_X + B \cdot C_Y}$$

applies.

This voltage U**$_{RES}$ is stored. The factors A and B depend on the voltage of the second reference-voltage source. Subsequently, a decision is made from the comparison in Step d1 and the derivation from Step e1 regarding the seat status, and by means of an additional comparison of U'$_{RES}$, U*$_{RES}$ and U**$_{RES}$ with stored limit values for the occupancy statuses, a specific occupancy status is assigned. Thus, to determine the occupancy status of the seat, all four resulting voltages $U_{RES}$, U'$_{RES}$, U*$_{RES}$ and U**$_{RES}$ are used.

In another embodiment example of the method, the voltage of the second reference-voltage source is set iteratively in that a Step is performed after c3.3 in which the voltage U*$_{REF}$ is reset, preferably to the value U*$_{RES}$ from Step c3.3, and the Steps c3.1, c3.2 and c3.3 with subsequent setting U*$_{REF}$ are repeated several times.

The arrangement for capacitive seat-occupancy recognition based on the invention comprises a reference capacitor that possesses a capacitance $C_{REF}$ with respect to a first reference potential of a vehicle, a sensor electrode integrated into a seat that possesses a capacitance $C_X$ with respect to a first reference potential, an at least parasitically-present capacitance at $C_Y$ of the sensor electrode with respect to a second reference potential or the vehicle ground, a first switch that connects the reference capacitor and a reference-voltage source of known voltage $U_{REF}$ with the reference potential, a second switch that connects the sensor electrode with the reference capacitor, and a third switch that connects the sensor electrode with the reference potential and the at least parasitically-present capacitance with the vehicle ground. As mentioned above, the reference potential for the duration of seat-occupancy recognition is an essentially temporally-unchangeable differential voltage to the vehicle ground.

In another embodiment example of the arrangement, a fourth switch is provided that connects the connection point of the reference capacitor $C_{REF}$ to the first switch and the second switch with the first reference potential, and a fifth switch is provided that connects the connection point of the sensor electrode $C_X$ to the second switch and the third switch and the at least parasitically-present capacitance $C_Y$ of the sensor electrode with of the reference-voltage source $U_{REF}$.

The arrangement can advantageously be used with a thermal conductor of the seat heater of a vehicle seat. For this, the corresponding thermal conductor, which is a component of a seat heater of a seat, is connected at its one end via a sixth switch with an operating-voltage source $U_B$, that for its part is connected to the vehicle ground, and at its other end is connected to the vehicle ground via a seventh switch, by means of which the at least parasitically-present capacitance $C_Y$ between the connection point of the sensor electrode is connected with the second switch and with the third switch on the one side and is connected on the other side with the thermal conductor (at any location of the thermal-conductor layout, for example at the connection with the sixth switch). Furthermore, an at least parasitically-present external capacitance $C_{EXT}$ is drawn in that it is connected on the one side to the first reference potential or to the vehicle ground, and is connected on the other side (at any location of the thermal-conductor layout) with the thermal conductor, and whereby furthermore this connection point is connected via an eighth switch with a second reference-voltage source U*$_{REF}$, with $$U_{REF}^* \cong U_{REF} \frac{C_{REF}}{C_{REF} + C_X}$$

for the case of the unoccupied seat unter under neglect of the parasitic capacitance $C_Y$ selected in magnitude to be similar to the voltage $U_{RES}$, that for its part is connected to a reference potential, and furthermore this connection point is connected via a ninth switch with the reference potential of the reference-voltage source U*$_{REF}$.

In another embodiment example of the arrangement, the voltage for voltage source U*$_{REF}$ is taken from the voltage source $U_{REF}$, and a capacitance $C_{CTRL}$ is formed between the thermal conductor and the connection between the eighth switch and the ninth switch to imitate the parasitic capacitance of the voltage U*$_{REF}$, whereby the following applies for the value of the capacitance $C_{CTRL}$:

$$C_{CTRL} \cong C_{EXT} \frac{U_{REF}^*}{U_{REF} - U_{REF}^*}$$

This arrangement is advantageous if no second reference voltage U*$_{REF}$ is available, so that access exists only to the first reference voltage $U_{REF}$.

Furthermore, an altered circuit structure may be used in which the first switch and the fourth switch are no longer directly connected with the reference capacitance $C_{REF}$ in that a new network node $P_{REF}$ is formed by the connection of the first switch and of the fourth switch, and an additional channel-selector switch is provided that creates the connection between the newly-established network nodes $P_{REF}$ on the one side and the reference capacitance $C_{REF}$ and the second switch on the other side.

The additional channel-selector switch then possesses a closed condition if the first switch and/or the fourth switch are closed, and the additional channel-selector switch then comprises an open condition if both the first switch and the fourth switch are opened.

This arrangement is advantageous if $C_{REF}$ is not to be implemented as an individual component, but rather in integrated form as a part of another circuit arrangement, and there comprises a connection with a channel-selector switch (conventionally known as a multiplexer).

In the circuits described above, the sixth switch and the seventh switch may each be implemented with a MOSFET with triggering electronics whereby the above-described external capacitance $C_{EXT}$ each represents one-half of the Drain/source-capacitors that is visible in the blocked condition of the MOSFETs.

Furthermore, the first through fifth switch, the eighth switch, the ninth switch and the reference capacitance $C_{REF}$ may be implemented through a microcontroller with a sample-and-hold capacitor in an Analog-to-Digital converter (ADC) for $C_{REF}$ and with a channel multiplexer at the input of the ADC for the first switch, the second switch and the fourth switch and with a first port driver for the third switch and the fifth switch and with a second port driver for the eighth switch and the ninth switch.

If the arrangement possesses the above-mentioned properties that the voltage for voltage source $U^*_{REF}$ is taken from the voltage source $U_{REF}$ and a capacitance $C_{CTRL}$ is created between the thermal conductor and the connection between the eighth switch and the ninth switch to imitate the voltage von $U^*_{REF}$, with $$C_{CTRL} \cong C_{EXT} \frac{U^*_{REF}}{U_{REF} - U^*_{REF}},$$

a second port driver would be used for triggering of the eighth switch and triggering of the ninth switch.

The first through fifth switches, the eighth switch, the ninth switch and the reference capacitance $C_{REF}$ may be created by a micro-controller with sample-and-hold capacitor in an Analog-to-Digital converter (ADC) for $C_{REF}$ and with the channel multiplexer placed in front of the ADC for the second switch and the additional channel-selector switch and with a first port driver for the third switch and the fifth switch and with a second port driver for the eighth switch and the ninth switch, or with a second port driver for triggering of the eighth switch and triggering of the ninth switch and with a third port driver for the first switch and the fourth switch.

With the use of three additional I/O-Ports, the arrangement based on the invention may be integrated into an existing seat-heating electronics by using components of the CPU for the capacitance $C_{REF}$ of the reference capacitors and the various switch components. The addition of the sensor electrode to the thermal-conductor layout is significantly less expensive than an expensive electronic detection circuit or complex components in order to relieve a seat heater without sensor electrodes from capacitive loads caused by switch capacitances. Materials expense is reduced in comparison existing systems for use of the thermal-conductor layout as sensor electrodes by less than 10%.

The sampling procedure makes it possible to clearly distinguish water seepage from a loading of the seat with objects. It is also possible to recognize a current leakage falsifying the result.

The described arrangement allows the electronic circuit to trigger the heating and seat-occupancy recognition to be integrated either as a small electronics module in the seat base (few external components) or separately, e.g., in the seat frame of the vehicle.

Use of an additional detection wire in the seatback of the vehicle makes it possible to measure the distance between the back of a person and the second detection wire. This allows determination of out-of-position situations.

It is not absolutely necessary to deploy the heating wire and sensor electrodes in a single plane. Such a system would be more expensive to manufacture, however.

Crossing the heating wire and sensor electrodes reduces the sensitivity, but one may allow such crossings if adequate crossing-free conductor sections remain.

Systems may also be created in which more than one sensor electrode is used. This may also be useful for out-of-position situations.

The sequence of procedure steps is an example, and need not necessarily be performed in the described progression, so that Steps may be exchanged one for another.

For a full understanding of the present invention, reference should now be made to the following detailed description of the preferred embodiments of the invention as illustrated in the accompanying drawing.

DESCRIPTION OF THE PREFERRED EMBODIMENT

Figure 1:
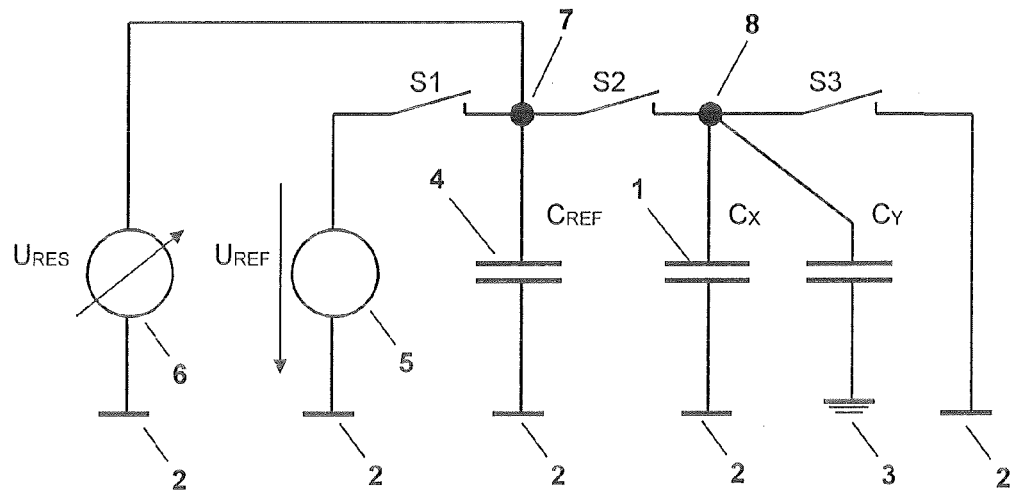
FIG. 1 is a circuit diagram of a first embodiment example that uses a sensor electrode.

The preferred embodiments of the present invention will now be described with reference to FIGS. 1-12 of the drawings. Identical elements in the various figures are designated with the same reference numerals.

In the following, various embodiment examples of the arrangement for seat-occupancy recognition for vehicle seats are described. The method performed using these arrangements is based on the fact that an unknown capacitance is measured.

In the first embodiment example, as shown in FIG. 1, the arrangement for capacitive seat-occupancy recognition integrated into a seat possesses a capacitance $C_X$ with respect to a first reference potential 2. Furthermore, a reference capacitance $C_{REF}$ is present in the circuit, whereby $C_{REF}$ is the known capacitance of a reference capacitor 4 with respect to a first reference potential 2 of a vehicle. Finally, a capacitance $C_Y$ is present that involves an at least parasitically-present capacitance of the sensor electrode 1 with respect to a second reference potential 3 in which in this arrangement the vehicle ground is involved.

A first switch S1 connects the reference capacitor 4 and a reference-voltage source 5 of known voltage $U_{REF}$ connected with the reference potential 2. A second switch S2 connects the sensor electrode 1 with the reference capacitor 4, and a third switch S3 connects the sensor electrode 1 and the at least parasitically-present capacitance with the vehicle ground 3 with the reference potential 2.

The node point between the second switch S2, third switch S3, sensor electrodes 1 and parasitic capacitance $C_Y$ is designated with the reference index 8. The reference potential is for the duration of the seat-occupancy recognition an essentially temporally-immutable differential voltage to the vehicle ground. Furthermore, a voltage-measurement device 6 that is connected to the node point 7 between first switch S1, second switch S2 and reference capacitor 4 is present to measure a resulting voltage $U_{RES}$ that is present and is connected at the other end to the first reference potential 2.

In order to recognize the seat-occupancy status of the seat next in a Step a1, the reference capacitor 4 is charged to the voltage $U_{Ref}$ of the reference-voltage source 5 in that the second switch S2 is opened and the first switch S1 is closed. By closing of the third switch S3, the capacitors $C_X$ and $C_Y$ are then discharged.

In a next Step b1, the first switch S1 and the third switch S3 are opened in order to create a state of oscillation in which the capacitance $C_{REF}$ of the reference capacitors 4, the capacitance $C_X$ of the sensor electrode 1 with respect to the reference potential 2 and the parasitically present capacitance $C_Y$ retain their charge.

A Step c1 follows in which the second switch S2, which is opened, is closed again so that the charge $C_{REF}$ of the reference capacitor 4 is distributed to the capacitors $C_{REF}$, $C_X$ and $C_Y$. This creates a resulting voltage $U_{RES}$. For the resulting voltage $U_{RES}$ the following applies:

$$U_{RES} = U_{REF} \cdot \frac{C_{REF}}{C_{REF} + C_X + C_Y}.$$

The resulting voltage is measured at the voltage-measurement device 6 and stored.

There follows a Step d1 in which the resulting voltage $U_{RES}$ is compared with stored limit values that are assigned to specific occupancy or seat statuses. From this comparison, an occupancy or seat status is derived in an additional Step e1.

It is apparent that a low-cost structure may be established in this manner in which a detection element in the form of the sensor electrode 1 is added that forms the capacitance $C_X$ dependent on occupancy status with respect to the reference potential of the evaluation circuit, and with respect to the vehicle ground a second capacitance $C_Y$ dependent on occupancy status and/or seat status.

The method above may be performed iteratively in order to compile the result of a large number of measurements, and to average over several points in time, or to sum the results of measurements. It is also possible during iterated measurements to make connections of temporal alterations of the resulting voltage $U_{RES}$ with typical entry and exit procedures in order thus to validate the status of seat occupancy.

In order to integrate the sensor electrode into a seat, a layout mat may be used that is not shown in the Figures and that lies in a finished seat either at its surface of the seat cushion, or is between the upper side of the seat cushion and the seat upholstery, or is sewn into the seat upholstery.

In addition to the sensor electrode, such a layout mat may comprise the thermal conductor for a seat heater (see FIG. 10) if such a seat heater is provided in the seat. It is basically insignificant whether the sensor electrode and the thermal conductor lie within the same plane or in different planes. A single-layer structure is preferred in which heating wire and sensor electrodes are inserted between two layers, for example of foam rubber or fleece.

Figure 2:
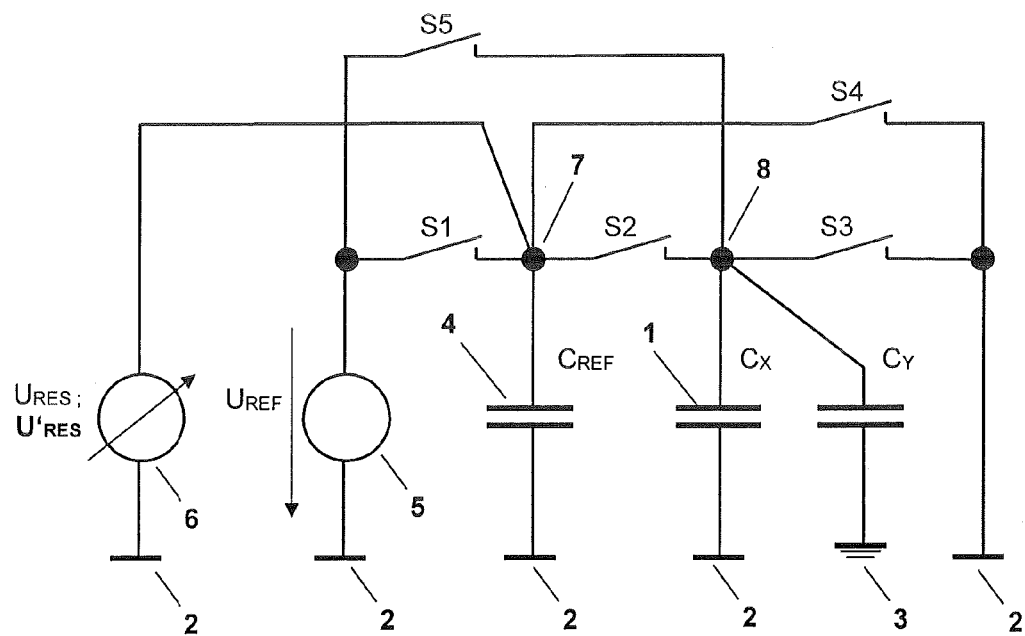
FIG. 2 is a circuit diagram of a second embodiment example in which, in contrast to the first embodiment example, two additional switches are used.

FIG. 2 shows a second embodiment example in which, in addition to the circuit arrangement as shown in FIG. 1, a fourth switch S4 is present that connects the connection point 7 of the reference capacitor 4 to the first switch S1 and the second switch S2 with the first reference potential 2. Furthermore, a fifth switch S5 is present that connects the connection point 8 of the sensor electrode 1 to the second switch S2 and the third switch S3 and the at least parasitically-present capacitance $C_Y$ of the sensor electrode 1 with the reference-voltage source $U_{REF}$.

With this circuit arrangement, now in addition to the procedure steps performed with the arrangement per FIG. 1 and described above, a Step a2.0 is performed before Step a1 in which the fourth switch S4 and the fifth switch S5 are opened.

Then, after Step c1, which is described above, a Step c2.1 is performed in which the second switch S2 is opened again and then, by closing of the fourth switch S4, the reference capacitor 4 is discharged to the first reference potential 2. The fifth switch S5 is closed in order to charge the capacitors $C_X$ and $C_Y$ up to the reference voltage $U_{REF}$ Of the reference-voltage source 5.

After this Step c2.1 follows a Step c2.2 in which the fourth switch S4 and the fifth switch S5 are opened. This creates a state of oscillation which the capacitance $C_{REF}$ and the capacitors $C_X$ and $C_Y$ retain their charge.

Subsequently, Step c2.3 is performed in which the second switch S2 is closed so that the charge of the capacitors $C_X$ and $C_Y$ is distributed to the capacitors $C_{REF}$, $C_X$ and $C_Y$ and a second resulting voltage $U'_{RES}$ is set, that is measured at the voltage-measurement device 6, with $$U'_{RES} = U_{REF} \cdot \frac{C_X + C_Y}{C_{REF} + C_X + C_Y}.$$

Then follows the Step d1 described above, then a Step d2 in which additionally the second resulting voltage $U'_{RES}$ and/or the differential between both resulting voltages $U_{RES}$ and $U'_{RES}$ are compared with stored limit values to which specific occupancy or seat statuses are assigned.

After the Step e1 described above is performed, follows a Step f2 in which the differential between the reference voltage $U_{RES}$ and the sum of the resulting voltages $U_{RES}$ and $U'_{RES}$ is compared with the stored limit values. Through this comparison, the charge loss arising during the testing performed can be recognized in order to validate or discard or alter the result of the derivation of the occupancy status from the comparison in Step e1.

In the arrangement described above per FIG. 2 and the thus-performed method, $C_X$ is the capacitance of the sensor electrode 1 with respect to a reference potential 2 of the vehicle, and $C_Y$ is an at least parasitically-present capacitance of the sensor electrode 1 with respect to the vehicle ground. Upon closer observation of the method represented, one may recognize that not only $C_X$ is evaluated for the measurement, but rather more importantly, the sum of $C_X$ and $C_Y$. However, the problem arises here that a capacitance increase of this summary capacitance is not necessarily caused by the presence of a person. Rather, water in small amounts in the heating mat and/or the vicinity of the sensor electrode 1 (a mere 10 ml) may lead to a clear influence of the parasitic capacitance $C_Y$ in a direction that indicates the occupancy of the vehicle seat by a person, so that the derivation from this regarding the occupancy and/or seat status is false. Furthermore, other elements such as supply lines and the heating wire itself already form a relatively large basis value of the capacitance $C_Y$, by means of which alteration of the summary capacitance $C_X+C_Y$ because of seat occupancy appears much smaller than in the case of a full-surface sensor. It is apparent that this influence by moisture on the capacitance measurement is critical for the determination of the occupancy and seat status.

Figure 3:
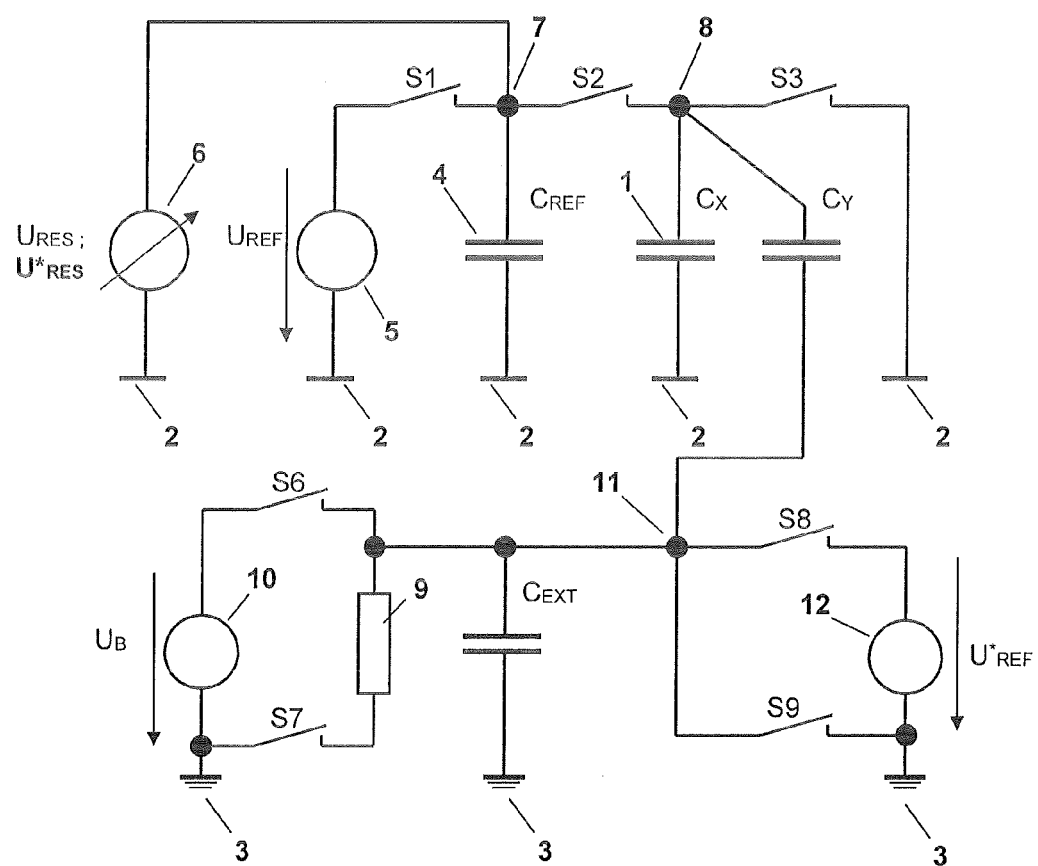
FIG. 3 is a circuit diagram of a third embodiment example in which, in contrast to the first embodiment example, is based on a thermal conductor with triggering switches and to a coupling capacitor between thermal conductor and sensor electrode.

In order to minimize the influence of the heater on the capacitive detection, a circuit structure as shown in FIG. 3 is used.

The upper part of the circuit arrangement per FIG. 3 corresponds to that of the one shown in FIG. 1 so that, regarding the description of this part of the circuit, reference is made to the embodiment examples per FIG. 1.

In addition to the arrangement per FIG. 1, a thermal conductor 9, which is a component of the seat heater of the seat, is shown. The thermal conductor 9 is connected at its one end via a sixth switch S6 with an operating-voltage source 10 (with voltage $U_B$) that for its part is connected to the vehicle ground (second reference potential 3). On its other end, the thermal conductor 9 is connected with the vehicle ground (second reference potential 3) via a seventh switch S7. The one side of the thermal conductor 9, which is connected with the switch S6, is connected with the parasitically-present capacitance $C_Y$. Furthermore, this connection is connected at a connection point 11 via an eighth switch S8 with a second reference-voltage source 12 with voltage $U^*_{REF}$. Furthermore, the connection point 11 is connected via a ninth switch S9 with the reference potential 3 of the reference-voltage source 12.

Finally, an at least parasitic external capacitance $C_{EXT}$ is present in the circuit that on the one side is connected to the second reference potential 3 and on the other side with the thermal conductor on its side that is connected with the switch S6.

By closing the switches S6 and S7 and with open switches S8 and S9, the thermal conductor 9 is connected to battery voltage and produces heat.

The voltage $U^*_{REF}$ of the second reference-voltage source 12 is selected to be similar in magnitude to the voltage $U_{RES}$ in a similar arrangement in which the parasitic capacitance $C_Y$ is not present or is very much smaller than the capacitance $C_X$ of the sensor electrode would be.

Seat-occupancy recognition is performed using the arrangement per FIG. 3 as follows:

Before the above-mentioned Step a1 described in FIG. 1, a Step a3.0 is performed in which the sixth switch S6 and the seventh switch S7 are opened in order to render the thermal conductor 9 voltage-free. Subsequently, after Step a1 has been performed, a Step a3.1 is performed in which, by closing of the ninth switch S9, the at least parasitic capacitance $C_{EXT}$ is discharged.

After Step c1 has been performed, there follows a Step c3.1 in which the reference capacitor 4 is charged up to the voltage $U_{REF}$ of the reference-voltage source in that the second switch S2 is opened and the first switch S1 is closed. The capacitors $C_X$ and $C_Y$ are discharged by closing the third switch S3. Additionally, since the ninth switch S9 remains closed, it is ensured that the at least parasitically-present capacitance $C_{EXT}$ remains in a discharged condition.

There follows a Step c3.2, in which a state of oscillation is created by opening the first switch S1 and the third switch S3 and by opening the ninth switch S9; in this condition, the capacitors $C_{REF}$, $C_X$, $C_Y$ and the parasitically present external capacitance $C_{EXT}$ retain their charge.

In the subsequent Step c3.3, the charge of the reference capacitors is distributed to the capacitors $C_{REF}$ and $C_X$ by closing the second switch S2 and simultaneous closing of the eighth switch S8; simultaneously, the voltage $U^*_{REF}$ is applied to the connection between the capacitors $C_Y$ and $C_{EXT}$ and the eighth switch S8. This achieves the fact that the voltage increase at the parasitically-present coupling capacitor $C_Y$ turns out to be less than in Step c1, whereby for the resulting voltage $U^*_{RES}$ is approximately equal to $$U^*_{RES} = U_{REF} \cdot \frac{C_{REF}}{C_{REF} + C_X + A \cdot C_Y},$$

This voltage $U^*_{RES}$ is in any case greater than the voltage $U_{RES}$ in Step c. It is stored. The factor A depends on the voltage of the second reference-voltage source 12 ($U^*_{REF}$) and the occupancy status of the seat. In the case of the unoccupied seat, A is near zero, and in the case of the occupied seat, A is not greater than 1. Subsequently, from the comparison in Step d1 and the derivation from Step e1 as has been explained above regarding the seat status, and from a comparison of $U^*_{RES}$ with stored limit values for the occupancy statuses, a specific occupancy status is assigned. Thus, both resulting voltages $U_{RES}$ and $U^*_{RES}$ are used for determination of occupancy status of the seat, whereby with violation of the stored upper limit values and/or overruling alteration of the second resulting voltage $U^*_{RES}$ and only weak (i.e., somewhat less than half as strong) alteration and/or no violation of the first voltage $U_{RES}$ regarding occupancy of the seat is closed, with a common alteration up to a defined degree (i.e., approximately equally strong) and/or a similarly-oriented rise or drop of both resulting voltages $U_{RES}$ and $U*_{RES}$ to a drift of the reference capacitance $C_{REF}$ or of the reference voltage $U_{REF}$ without alteration of the occupancy status of the seat is determined, and it is checked whether the stored limit values are to be changed to new limit values, and with a violation of the limit values and/or the overruling first resulting voltage $U_{RES}$ and a very weak (i.e., somewhat less than half as strong) alteration and/or no violation with the stored limit values of the second voltage $U*_{RES}$ regarding an unoccupied seat that is damp, however, is determined.

Figure 4:
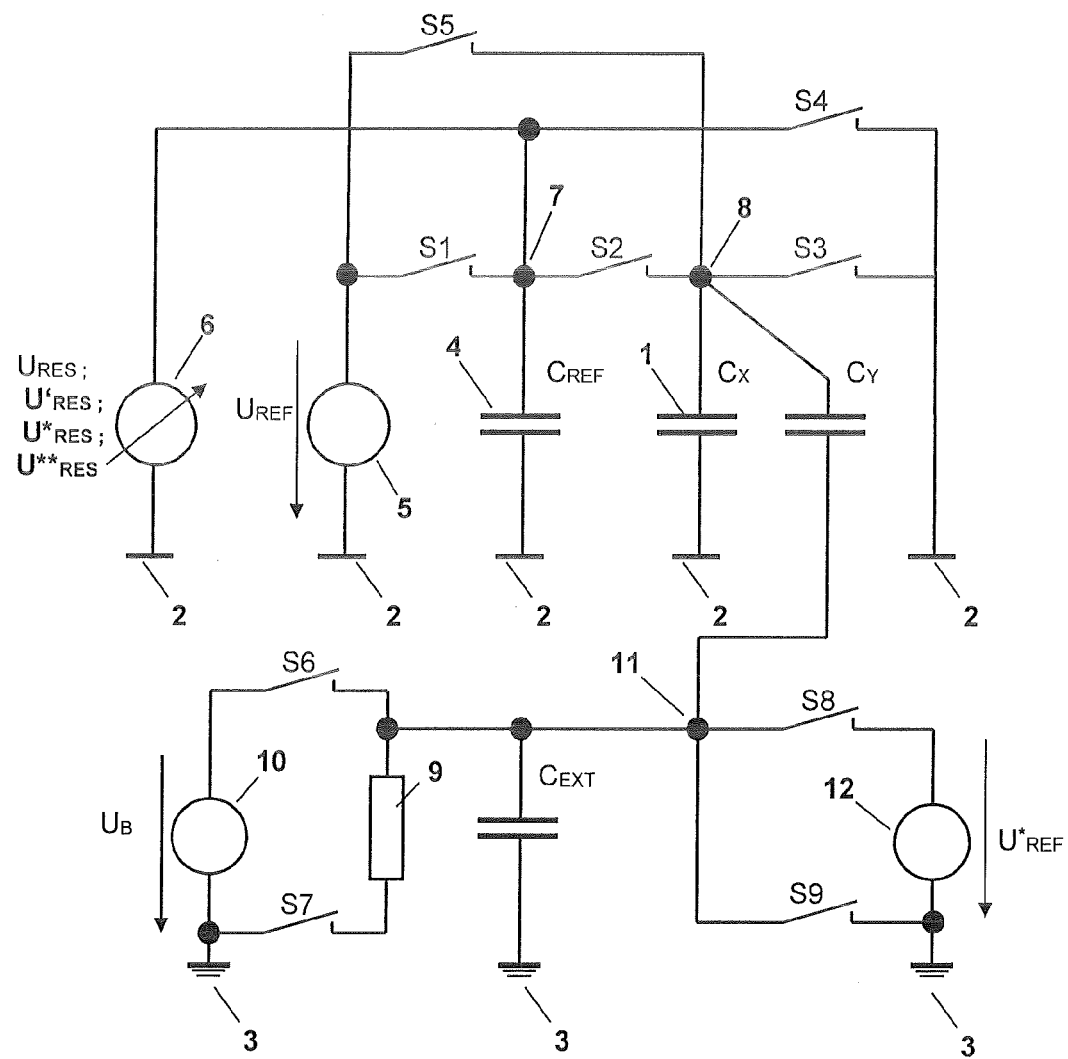
FIG. 4 is a circuit diagram comparable with FIG. 3 of a fourth embodiment example in which, as in FIG. 2, two additional switches are used.

The circuit arrangement as shown in FIG. 4, essentially corresponds to that described above FIG. 3, but additionally the fourth switch S4 and the fifth switch S5 are provided that are also present in the circuit arrangement of FIG. 2. To that extent, reference is made regarding the circuit structure in FIG. 4 to the previous embodiment examples per FIGS. 2 and 3. The circuit arrangement of FIG. 4 has the advantage with respect to the circuit arrangement of FIG. 3 that a charge loss occurring during the sampling process may be recognized by means of the validation in the description of FIG. 2.

Seat-occupancy recognition is performed with the arrangement per FIG. 4 as follows:

Before the Step a1 described above in FIG. 1, the Step a2.0 is performed in which the fourth switch S4 and the fifth switch S5 are opened.

Then, after Step c1 or the Step c3.3, which are described above, the Steps c2.1, c2.2 and c2.3 that were described above for FIG. 2 is performed.

Additionally, a Step c4.1 is performed after Step c1 or the Step c3.3 or Step c2.3 in which the second switch S2 is opened again and subsequently the reference capacitor 4 is discharged to the first reference potential by closing of the fourth switch S4. By closing of the fifth switch S5 and of the eighth switch S8, the capacitance $C_X$ is charged up to the reference voltage $U_{REF}$ of the reference-voltage source 5, and the at least parasitically-present capacitance $C_Y$ is charged up to the voltage differential $U_{REF}$–$U_{REF}$, whereby the voltage $U_{REF}$ preferably possesses the same value as the first reference-voltage source.

There follows a Step c4.2 in which the fourth switch S4, the fifth switch S5 and the eighth switch S8 are opened so that an oscillation condition exists in which the capacitors $C_{REF}$, $C_X$ and $C_Y$ retain their charge.

After this, a Step c4.3 is performed in which the second switch S2 is closed so that the charge of the capacitance $C_X$ and $C_Y$ is distributed to the capacitors $C_{REF}$, $C_X$ and $C_Y$ and a resulting voltage $U_{RES}$ arises, whereby $$U^{}_{RES} = U_{REF} \cdot \frac{C_X + A \cdot C_Y}{C_{REF} + C_X + B \cdot C_Y}$$

This voltage $U**_{RES}$ is stored. The factors A and B depend on the voltage of the second reference-voltage source 12. Subsequently, a specific occupancy status is assigned from the comparison in Step d1 and the derivation from Step e1 regarding the seat status and from an additional comparison of $U'_{RES}$, $U*_{RES}$ and $U**_{RES}$ with stored limit values for the occupancy statuses. Thus, all four resulting voltages $U_{RES}$, $U'_{RES}$, $U*_{RES}$ and $U**_{RES}$ are used for determination of the occupancy status of the seat.

Figure 5:
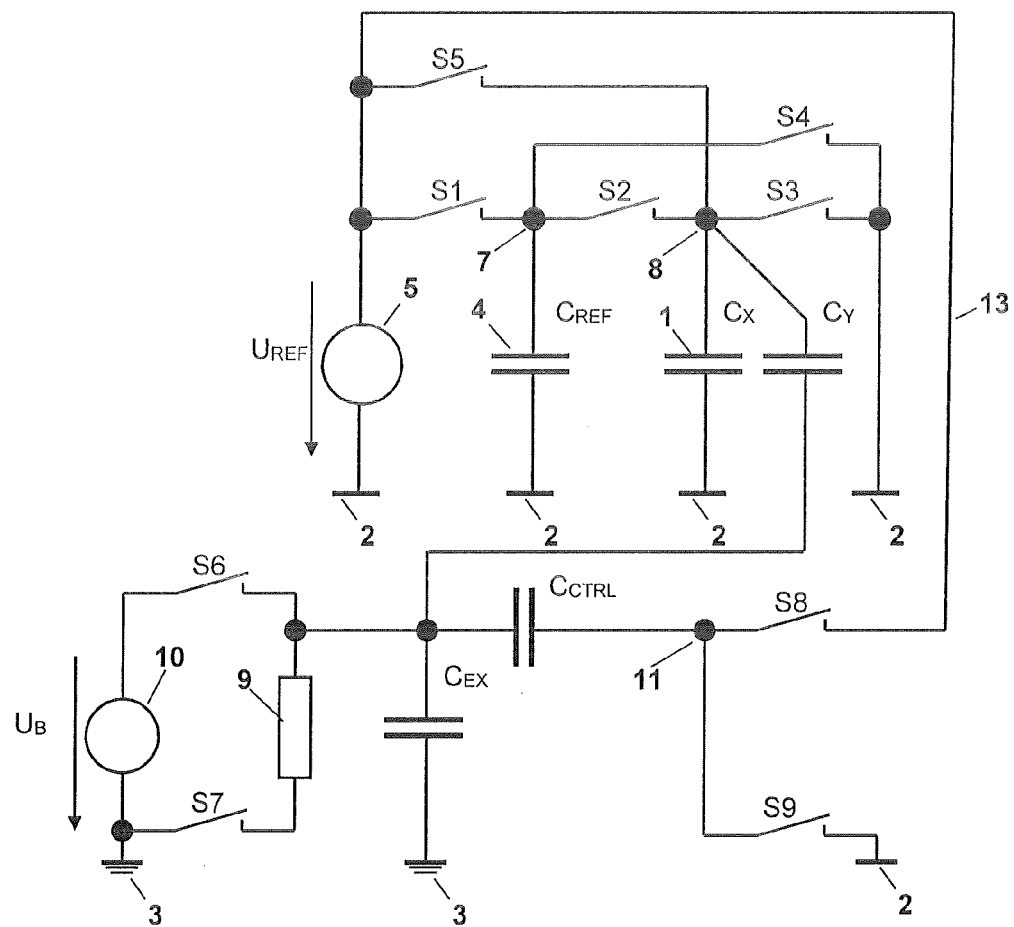
FIG. 5 is a circuit diagram of a fifth embodiment example in which the second reference voltage is replaced by an additional capacitance.

FIG. 5 shows a fifth embodiment example of the circuit arrangement based on the invention. The basic structure of the circuit arrangement corresponds to that of the circuit arrangement per FIG. 4. In contrast to the arrangement of FIG. 4, in the arrangement per FIG. 5, the voltage for voltage source $U*_{REF}$ is taken from the voltage source $U_{REF}$ in that the switch S8, which is after the node 11, is connected directly with the voltage source $U_{REF}$ via the line 13. Furthermore, a capacitance $C_{CTRL}$ is connected between the thermal conductor 9, and namely at the connection between the thermal conductor 9 and switch S6, and eighth switch S8 and the ninth switch S9 (connection point 11) in order thus to form a voltage of $U*_{REF}$. For the value of the capacitance $C_{CTRL}$, the following applies:

a. $C_{CTRL} \cong C_{EXT} \dfrac{U^*_{REF}}{U_{REF} - U^*_{REF}}$

Figure 6:
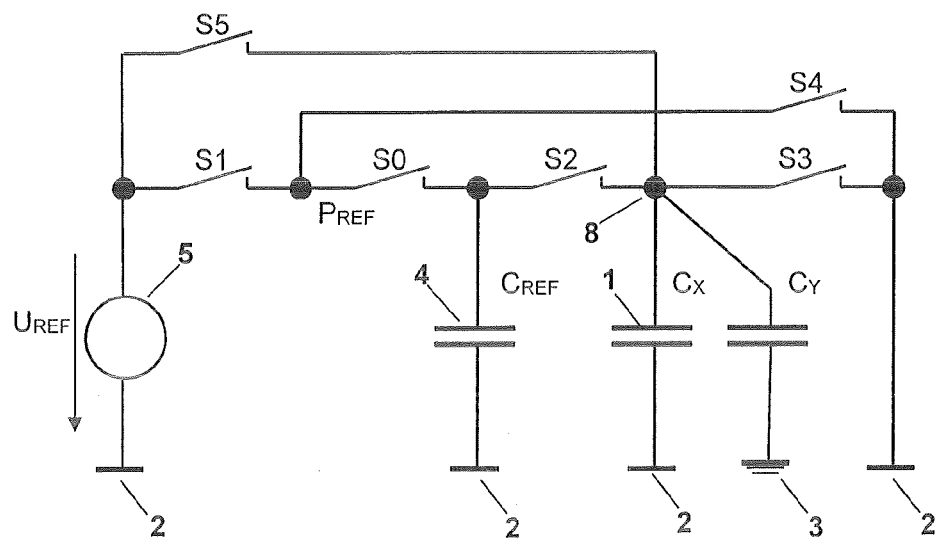
FIG. 6 is a circuit diagram of a sixth embodiment example derived from FIG. 2 in which an additional channel-selector switch for reference capacitance was inserted between the first and the fourth switch.

In a sixth embodiment example shown in FIG. 6, the first switch S1 and the fourth switch S4 are no longer directly connected with the reference capacitance $C_{REF}$ (via node point 7), as FIGS. 2, 4 and 5 show, but rather an additional network node designated with $P_{REF}$ to which the first switch S1 is connected with the fourth switch S4 and is connected with the additional channel-selector switch S0. The other end of this channel-selector switch S0 is connected with the second switch S2 and with the reference capacitance $C_{REF}$. This channel-selector switch S0 is always placed in a closed condition when the first switch S1 and/or the fourth switch S4 are closed. The channel-selector switch S0 is always in an open condition when the first switch S1 and the fourth switch S4 are both opened. This arrangement achieves the fact that, instead of a single reference capacitor $C_{REF}$, an integrated arrangement consisting of reference capacitor $C_{REF}$ and an arrangement of consisting of reference capacitor $C_{REF}$ and an arrangement of channel-selector switches may be used.

Figure 7:
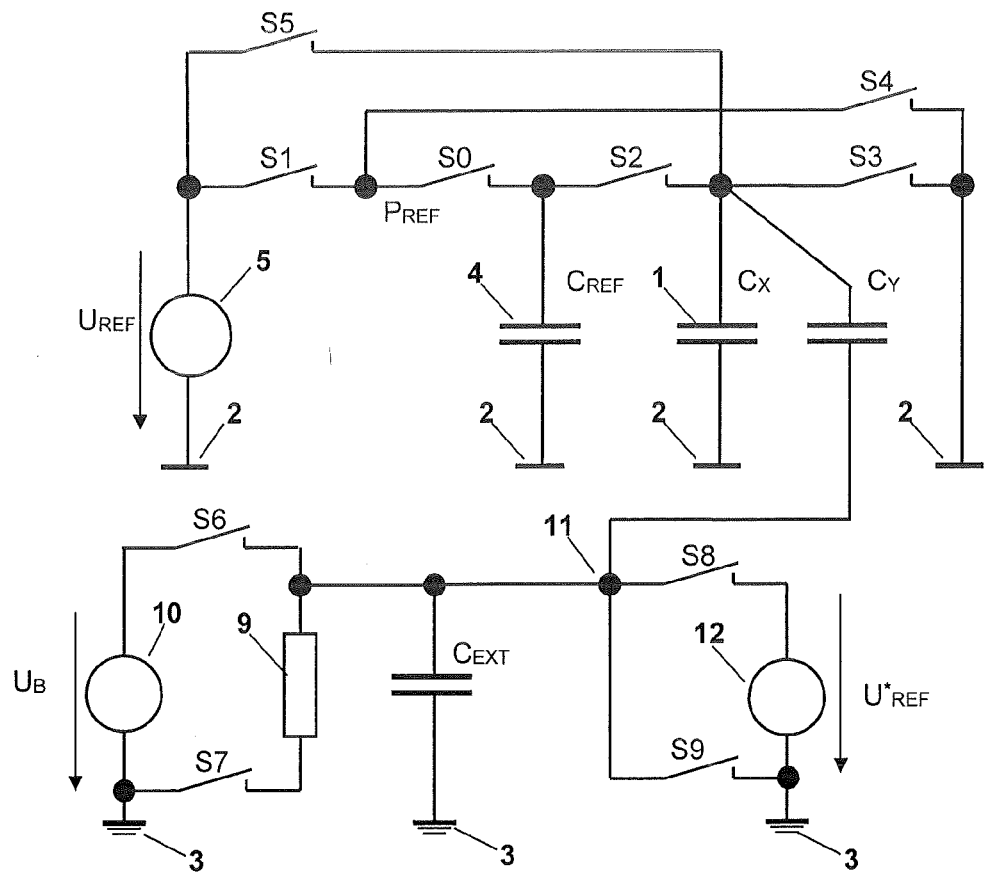
FIG. 7 is a circuit diagram of a seventh embodiment example derived from FIG. 4 in which an additional channel-selector switch for reference capacitance was inserted between the first and the fourth switch.

FIG. 7 represents an arrangement in which the circuit structure per FIG. 6 with the additional channel-selector switch S0 is integrated into the circuit structure per FIG. 4. To that extent, reference will be made to the previous embodiment examples in FIGS. 4 and 6. It must be emphasized that the arrangement per FIG. 7 offers the additional advantage that again, instead of a single reference capacitors $C_{REF}$, an integrated arrangement consisting of a reference capacitor $C_{REF}$ and an arrangement of channel-selector switches may be used.

Figure 8:
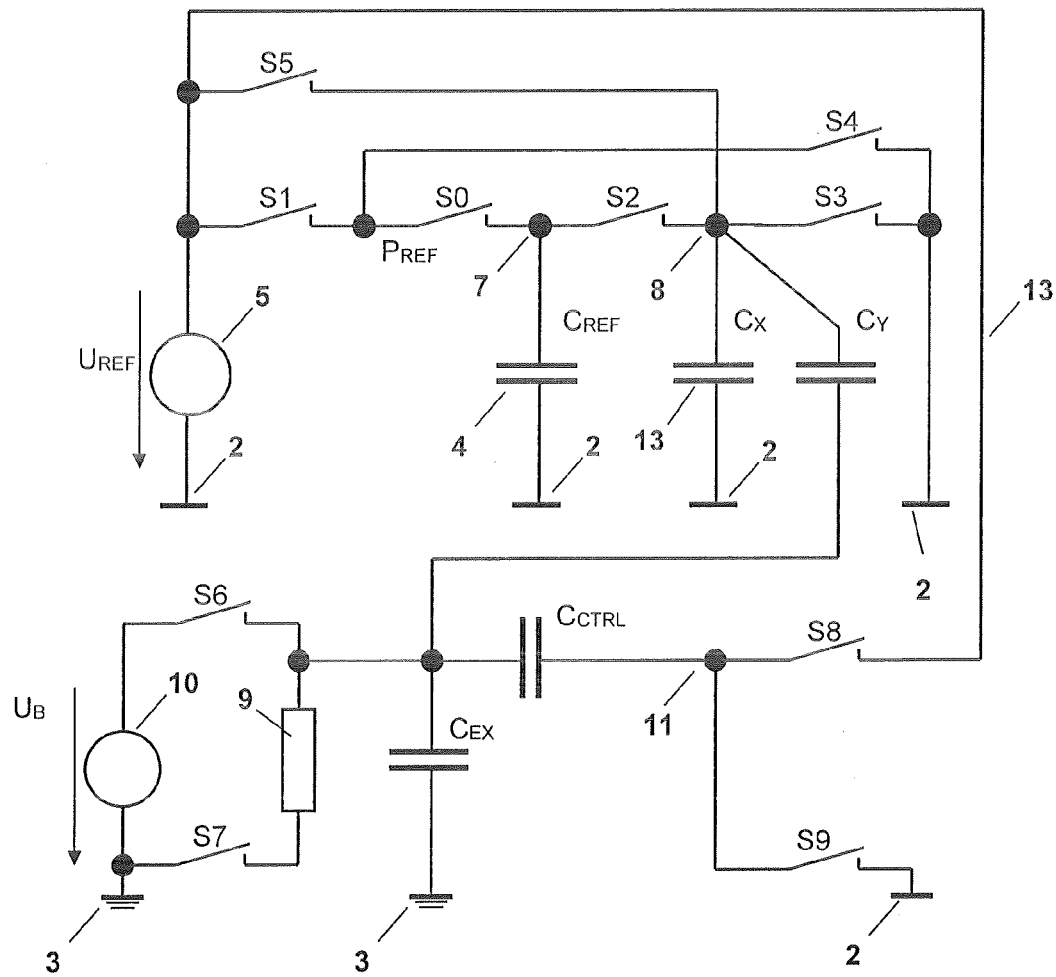
FIG. 8 is a circuit diagram of an eighth embodiment example derived from FIG. 5 in which an additional channel-selector switch for reference capacitance was inserted between the first and the fourth switch.

In an eighth embodiment example as shown in FIG. 8, the arrangement with the channel-selector switch S0 per FIG. 6 is inserted into the arrangement per FIG. 5 in which the voltage for voltage source $U*_{REF}$ from the voltage source $U_{REF}$ is extracted from the voltage source $U_{REF}$, i.e., the switch S8 is connected directly with the voltage source $U_{REF}$ via the line 13 in which the voltage for voltage source $U*_{REF}$ is extracted from the voltage source $U_{REF}$, i.e., the switch S8 is directly connected with the voltage source $U_{REF}$ via the line 13.

Figure 9:
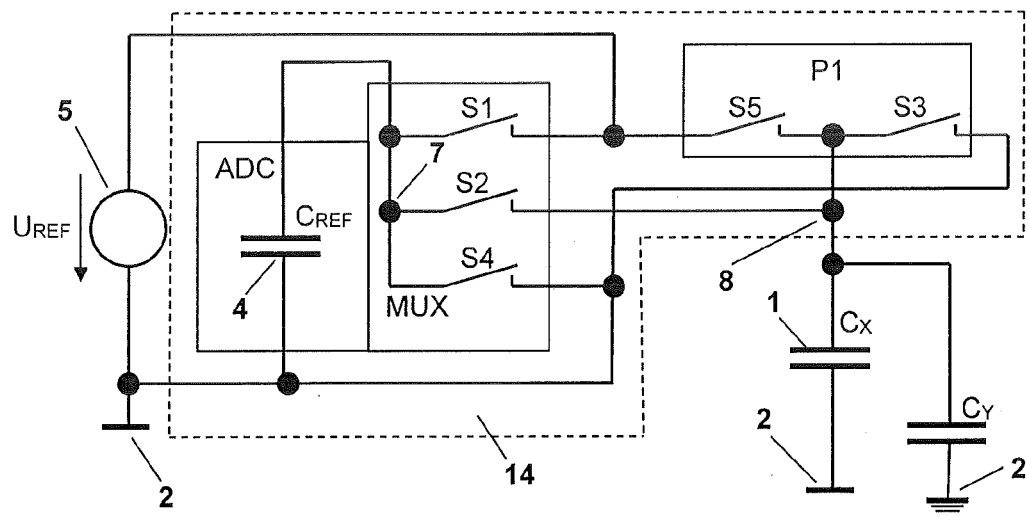
FIG. 9 is a circuit diagram of a ninth embodiment example derived from FIG. 2 in which a micro-controller is used that assumes various functions of the arrangement.

FIG. 9 shows an arrangement in which a micro-controller 14 with an analog-to-digital converter ADC, a channel multiplexer MUX, and a first port driver P1 is used. The micro-controller 14 implements circuit arrangement shown in FIG. 2. The first switch S1, the second switch S2 and the fourth switch S4 are assigned to the channel multiplexer MUX, and the third switch S3 and the fifth switch S5 are replaced by the first port driver P1. Furthermore, a sample-and-hold capacitor is present in the analog-to-digital converter ADC for the capacitance $C_{REF}$. The sensor electrode 1 of the capacitance $C_X$ and the parasitically present capacitance of the sensor electrode 1 are connected at the output of the micro-controllers 14, which is shown by the connection point 8. This provides a low-cost structure of the circuit arrangement for seat-occupancy recognition.

Figure 10:
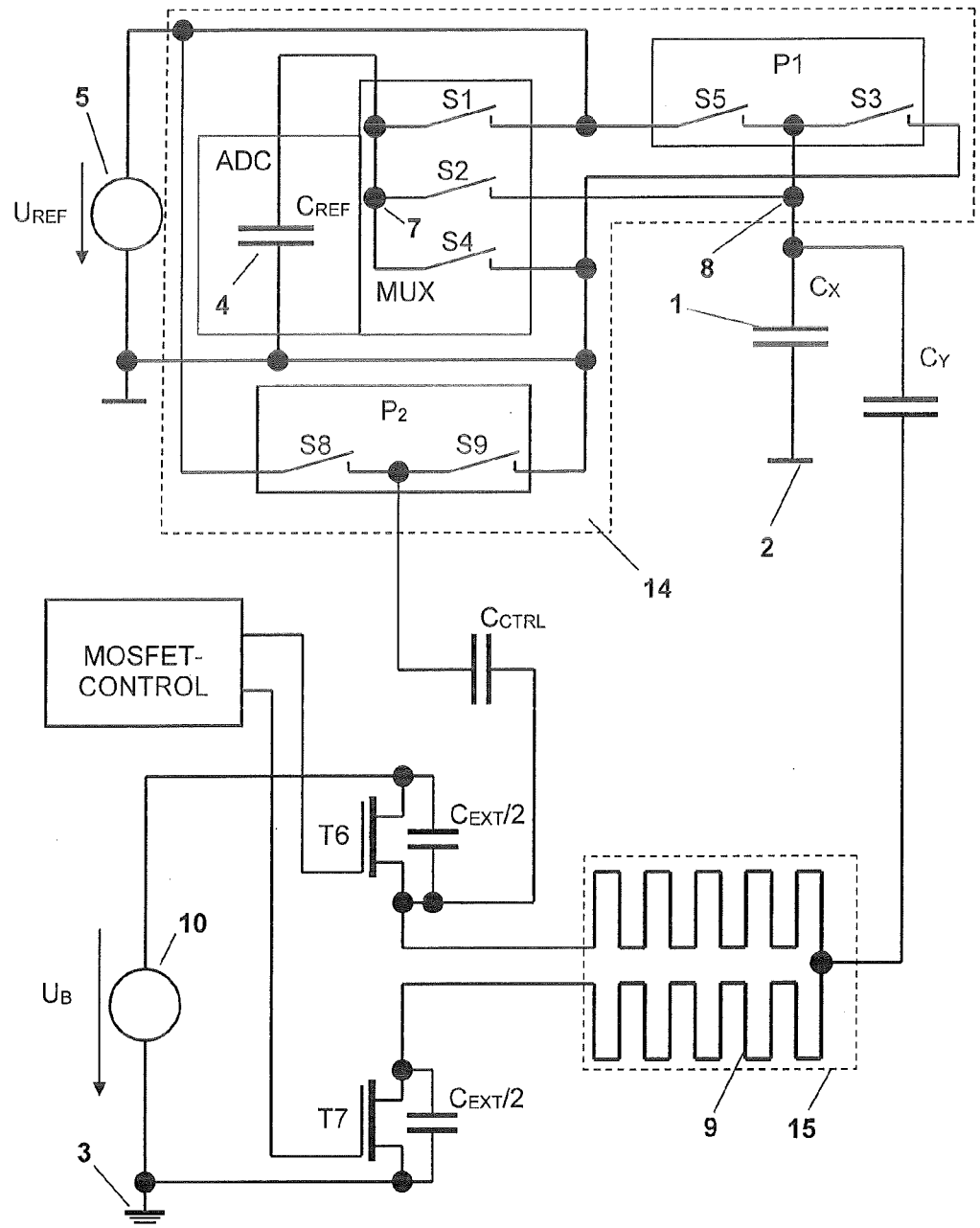
FIG. 10 is a circuit diagram of a tenth embodiment example derived from FIG. 5 in which a MOSFET triggering device is used along with a micro-controller.

The arrangement shown in FIG. 10 uses the micro-controller 14 comprising a second port driver P2 for triggering of the eighth switch S8 and triggering of the ninth switch S9 shown in circuit arrangements per FIGS. 3, 4 and 5. The micro-controller 14 thus controls the switch S8 and S9 by means of the second port driver P2.

Furthermore, in the circuit arrangement per FIG. 10, the sixth switch S6 and the seventh switch S7, which are present in the circuit arrangements of FIGS. 3, 4, 5 and 8, are each implemented using a MOSFET T6, T7 with electronic triggering circuit (MOSFET triggering device). The external capacitance $C_{EXT}$ is at least one-half each represented by the drain/source capacitors of each of the two MOSFETs T6 and T7 that are visible in the blocked condition of the MOSFETs.

FIG. 10 reveals that the thermal conductor 9 may be combined in a mat 15 with a layout pattern in order to heat the seat base or the seat-back surface of the seat of a vehicle.

Figure 11:
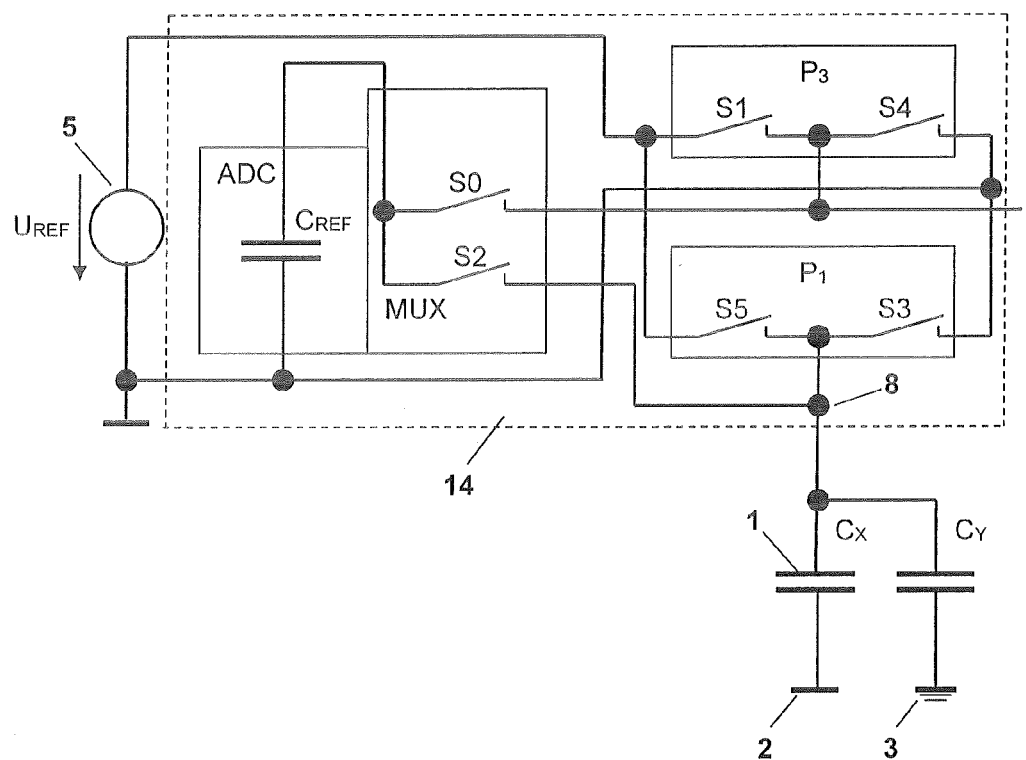
FIG. 11 is a circuit diagram of an eleventh embodiment example derived from FIG. 6 in which a micro-controller that assumes various functions of the arrangement is used.

The micro-controller 14, as FIG. 11 shows, executes the function of the additional channel-selector switch S0 that was described above per FIGS. 6, 7 and 8. For this, the micro-controller 14 includes a channel multiplexer MUX for the second switch S2 and this additional channel-selector switch S0. Furthermore, a first port driver P1 for triggering of the third switch S3 and of the fifth switch S5 and an additional port driver, designated in FIG. 11 as third port driver P3, for triggering of the first switch S1 and of the fourth switch S4 is present. Otherwise, the manner of function of this arrangement per FIG. 11 is such as has already been described above per the corresponding Figures.

Figure 12:
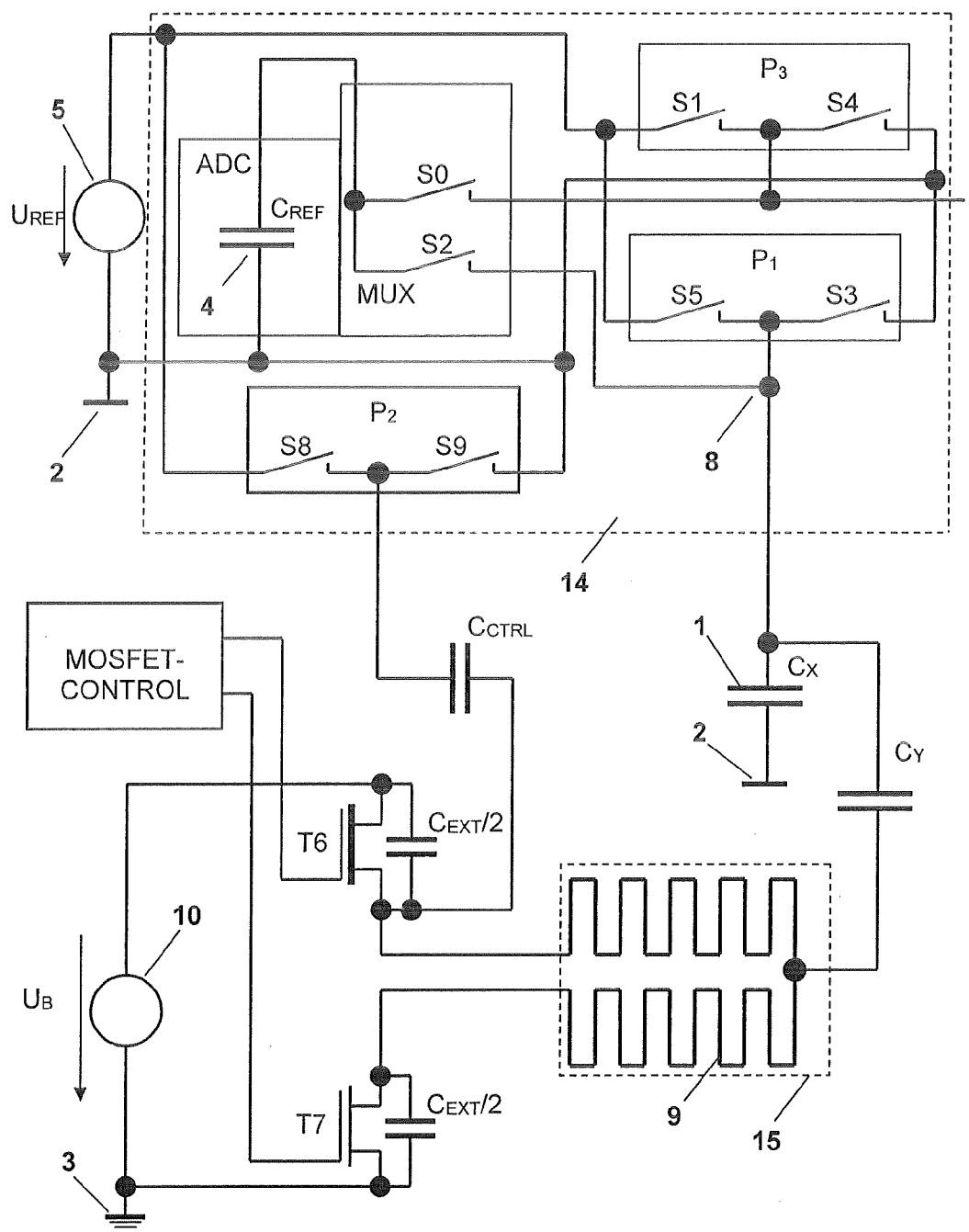
FIG. 12 is a circuit diagram of a twelfth embodiment example derived from FIG. 8 in which a micro-controller that assumes various functions of the arrangement is used.

FIG. 12 shows an arrangement corresponding to FIG. 10 with micro-controller 14 and MOSFET triggering device, but with the additional channel-selector switch S0 that is present in the arrangement per FIG. 11. Resultantly, the micro-controller 14 per FIG. 12 comprises the channel multiplexer MUX for the second switch S2 and the additional channel-selector switch S0, the first port driver P1 for triggering of the fifth switch S5 and of the third switch S3, the third port driver P3 for triggering of the first switch S1 and of the fourth switch S4, and the second port driver P2 for triggering of the eighth switch S8 and of the ninth switch S9.

The various embodiment examples of the arrangement for capacitive seat-occupancy recognition of a vehicle seat have been described above. Since the represented arrangements are identical or similar in various circuit details, the embodiments of a circuit arrangement may be transferred analogously to the details of the other circuit arrangements. Also, the circuit details may be derived directly from the Figures even if such details are not expressly described in the Description.

There has thus been shown and described a novel process and apparatus for capacitive seat occupant sensing for motor vehicles which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. Method for capacitive seat-occupancy recognition that is based on:
   $C_{REF}$ whereby $C_{REF}$ is the known capacitance of a reference capacitor with capacitance $C_{REF}$ with respect to a first reference potential of a vehicle,
   $C_X$ whereby $C_X$ is the capacitance of a seat sensor electrode integrated into a seat with respect to the first reference potential,
   $C_Y$ whereby $C_Y$ is the at least a parasitically-present capacitance of the sensor electrode with respect to a second reference potential or of the vehicle ground,
   and on a first switch (S1) that connects the reference capacitor and a reference-voltage source of known voltage $U_{REF}$ with the first reference potential,
   and on a second switch (S2) that connects the sensor electrode with the reference capacitor,
   and on a third switch (S3) that connects the sensor electrode with the reference potential,
   said method comprising the following steps to recognize the seat-occupancy status of the seat:
   a1 charging the reference capacitor to the voltage $U_{REF}$ of the reference-voltage source by opening the second switch (S2) and closing the first switch (S1), and discharging of capacitors $C_X$ and $C_Y$ by closing the third switch (S3),
   b1 opening the first switch (S1) and of the third switch (S3) to create a state of oscillations in which the capacitance $C_{REF}$ and the capacitors $C_X$ and $C_Y$ retain their charge,
   c1 closing the second switch (S2) so that the charge of the capacitance $C_{REF}$ is distributed to the capacitors $C_{REF}$, $C_X$ and $C_Y$ and a first resulting voltage $U_{RES}$ arises that is stored whereby $$U_{RES} = U_{REF} \cdot \frac{C_{REF}}{C_{REF} + C_X + C_Y}$$

d1 comparing the resulting voltage $U_{RES}$ with stored limit values assigned to specific occupancy-seat statuses, and
   e1 deriving of an occupancy-seat status from the comparison.

2. Method for capacitive seat-occupancy recognition per claim 1, wherein it is additionally based on
   a fourth switch (S4) that connects the connection point of the reference capacitor to the first switch (S1) and the second switch (S2) to the first reference potential, and
   a fifth switch (S5) that connects the connection point of the sensor electrode to the second switch (S2), and the third switch (S3) to the reference-voltage source with voltage $U_{REF}$,
   wherein
   a step a2.0 is performed before step a1 in which the fourth switch (S4) and the fifth switch (S5) are opened,
   a step c2.1 is performed after step c1 in which the second switch (S2) is again opened and subsequently the reference capacitor is discharged to the first reference potential by closing of the fourth switch (S4), and the fifth switch (S5) is closed in order to charge the capacitors $C_X$ and $C_Y$ up to the reference voltage $U_{REF}$ of the reference-voltage source, a step c2.2 is subsequently performed in which the fourth switch (S4) and the fifth switch (S5) are opened so that an oscillation condition exists in which the capacitance $C_{REF}$ and the capacitors $C_X$ and $C_Y$ retain their charge, a step c2.3 is subsequently performed in which the second switch (S2) is closed so that the charge of the capacitors $C_X$ and $C_Y$ is distributed to the capacitors $C_{REF}$, $C_X$ and $C_Y$ and a second resulting voltage $U'_{RES}$ is set whereby wherein $$U'_{RES} = U_{REF} \cdot \frac{C_X + C_Y}{C_{REF} + C_X + C_Y}$$

applies, then step d2 is performed after step d1 in which additionally the second resulting voltage $U'_{RES}$ and/or the differential between both resulting voltages $U_{RES}$ and $U'_{RES}$ with stored limit values assigned to specific occupancy or seat statuses are compared, and a step f2 is performed after step e1 in which the differential between the reference voltage $U_{REF}$ and the sum of the resulting voltages $U_{RES}$ and $U'_{RES}$ is compared with the stored values in order to recognize any charge loss arising during the performed test, and thus to validate or alter the result of the derivation of the occupancy status from the comparison in Step e1.

3. Method for capacitive seat-occupancy recognition per claim 1, wherein additionally the following is taken into account:

a thermal conductor that is a component of a seat heater of the seat, wherein the one end of the thermal conductor is connected via a sixth switch (S6) to an operating-voltage source with voltage $U_B$, that for its part is connected to the vehicle ground, and the other end is connected via a seventh switch (S7) with the vehicle ground (3), by means of which the at least parasitically-present capacitance $C_Y$ between the connection point of the sensor electrode is connected to the second switch (S2) and to the third switch (S3) on the one side and on the other side with the thermal conductor, and the method is based on an at least parasitic external capacitance $C_{EXT}$, that on the one side is connected to the first reference potential or to the vehicle ground and on the other side is connected with the thermal conductor, and whereby furthermore this connection point is connected via an eighth switch (S8) to a second reference-voltage source with voltage $U^*_{REF}$, preferably defined as $$U^*_{REF} \cong U_{REF} \cdot \frac{C_{REF}}{C_{REF} + C_X}$$

with capacitance $C_X$ for the case of the unoccupied seat, that for its part is connected to a first reference potential or the vehicle ground, and furthermore this connection point is connected via a ninth switch (S9) with the reference potential of the reference-voltage source $U^*_{REF}$, wherein a step a3.0 is performed before step a1 in which the sixth switch (S6) and the seventh switch (S7) are opened in order to render the thermal conductor voltage-free, a step a3.1 is performed after step a1 in which the at least parasitic capacitance $C_{EXT}$ is discharged by closing of the ninth switch (S9), a step c3.1 is performed after step c1 in which the reference capacitor $C_{REF}$ is charged to the voltage $U_{REF}$ of the first reference-voltage source by opening the second switch (S2) and by closing the first switch (S1), and the capacitors $C_X$ and $C_Y$ are discharged by closing the third switch (S3), and it is additionally ensured that the additionally at least parasitically-present capacitance $C_{EXT}$ remains discharged in that the ninth switch (S9) remains closed, a step c3.2 is then performed in which a state of oscillation is created by opening the first switch (S1) and the third switch (S3) and by opening the ninth switch (S9), in which the parasitically present external capacitance $C_{EXT}$ the capacitors $C_{REF}$, $C_X$, $C_Y$ retain their charge, a step c3.3 is then performed in which the charge of the reference capacitors is distributed to the capacitors $C_{REF}$ and $C_X$ by closing the second switch (S2) and by simultaneous closing of the eighth switch (S8) and the voltage $U^*_{REF}$ is simultaneously present at the connection between the capacitors $C_Y$ and $C_{EXT}$ and the eighth switch (S8), which achieves the fact that the voltage increase at the parasitically-present coupling capacitor $C_Y$ turns out to be smaller than in step c1, whereby for the resulting voltage $U^*_{RES}$ approximately $$U^*_{RES} = U_{REF} \cdot \frac{C_{REF}}{C_{REF} + C_X + A \cdot C_Y},$$

with $A<1$, applies, that is stored, whereby A is a factor that is dependent on the voltage of the second reference-voltage source $U^*_{REF}$ and the occupancy status of the seat, whereby A upon selection of $U^*_{REF}$ in the case of the unoccupied seat is near zero, and in the case of the occupied seat will not be greater than 1, then a decision is made from the comparison in step d1 and the derivation from step e1 regarding the seat status, and a specific occupancy status is assigned through a comparison of $U_{RES}$ and $U^*_{RES}$ with stored limit values for the occupancy statuses.

4. Apparatus for capacitive seat-occupancy recognition comprising: a reference capacitor that possesses a capacitance $C_{REF}$ with respect to a first reference potential of a vehicle, electrodes integrated into a seat sensor that possess a capacitance $C_X$ with respect to a first reference potential, at least parasitically-present capacitance $C_Y$ of the sensor electrode with respect to a second reference potential or the vehicle ground, a first switch (S1) that connects the reference capacitor and a reference-voltage source of known voltage $U_{REF}$ connected with the reference potential, a second switch (S2) that connects the sensor electrode with the reference capacitor, and a third switch (S3) that connects the sensor electrode with the reference potential, and the at least parasitically-present capacitance with the vehicle ground.

5. Apparatus as defined in claim 4, wherein a fourth switch (S4) connects a connection point of the reference capacitor to the first switch (S1) and the second switch (S2)

with the first reference potential, and wherein a fifth switch (S5) connects a connection point of the sensor electrode to the second switch (S2) and the third switch (S3), and connects the at least parasitically-present capacitance $C_Y$ of the sensor electrode with the reference-voltage source.

6. Apparatus as defined in claim 4, further comprising a thermal conductor, which is a part of a seat heater of the seat, wherein one end of the thermal conductor is connected via a sixth switch (S6) with an operating-voltage source, that for its part is connected to the vehicle ground, and the other end is connected via a seventh switch (S7) with the vehicle ground, by means of which the at least parasitically-present capacitance $C_Y$ between the connection point of the sensor electrode is connected with the second switch (S2) and with the third switch (S3) on the one side and on the other side with the thermal conductor, and an at least parasitically-present external capacitance $C_{EXT}$ that on the one side is connected to the first reference potential or to the vehicle ground and on the other side is connected to the thermal conductor, and whereby furthermore this connection point is connected via an eighth switch (S8) with a second reference-voltage source $U^*_{REF}$, with $$U^*_{REF} \cong U_{REF} \cdot \frac{C_{REF}}{C_{REF} + C_X}$$

for the case of an unoccupied seat being neglected by the parasitic capacitance $C_Y$, and furthermore this connection point is connected via a ninth switch (S9) with the reference potential of the second reference-voltage source.

7. Apparatus as defined in claim 6, wherein the voltage for the second reference-voltage source is extracted from the reference-voltage source with voltage $U_{REF}$, and a capacitance $C_{CTRL}$ is formed between the thermal conductor and the connection between the eighth switch (S8) and the ninth switch (S9) to imitate the voltage $U^*_{REF}$ of the second reference-voltage source, whereby for the value of the capacitance $C_{CTRL}$ $$C_{CTRL} \cong C_{EXT} \frac{U^*_{REF}}{U_{REF} - U^*_{REF}}$$

applies.

8. Apparatus as defined in claim 7, wherein a new network node ($P_{REF}$) is formed by the connection of the first switch (S1) and of the fourth switch (S4), and an additional channel-selector switch (S0) is provided that creates the connection between the newly-established network node ($P_{REF}$) on the one side, and between the reference capacitance $C_{REF}$ and the second switch (S2) on the other side.

9. Apparatus as defined in claim 8, wherein the sixth switch (S6) and the seventh switch (S7) are each implemented using a MOSFET (T6, T7) with electronic triggering circuit (MOSFET triggering device) whereby the external capacitance $C_{EXT}$ represents at least one-half of the drain/source capacitors of each of the two MOSFETs (T6, T7) that is visible in the blocked condition of the MOSFETs.

10. Apparatus as defined in claim 9, wherein the first through fifth switches (S1 through S5), the eighth switch (S8), the ninth switch (S9) and the reference capacitance $C_{REF}$ are formed by a micro-controller with sample-and-hold capacitor in an Analog-to-Digital converter (ADC) for $C_{REF}$ and with a channel multiplexer (MUX) before the ADC for the first switch (S1), the second switch (S2) and the fourth switch (S4) and with a first port driver (P1) for the third switch (S3) and the fifth switch (S5), and with a second port driver (P2) for the eighth switch (S8) and the ninth switch (S9).

11. Apparatus as defined in claim 9, wherein the first through fifth switches (S1 through S5), the eighth switch (S8), the ninth switch (S9) and the reference capacitance $C_{REF}$ are formed by a micro-controller with sample-and-hold capacitor in an analog-to-digital converter (ADC) for $C_{REF}$ and with a channel multiplexer (MUX) for the second switch (S2) and the additional channel-selector switch (S0), and with a first port driver (P1) for the third switch (S3) and the fifth switch (S5), and with a second port driver (P2) for the eighth switch (S8) and the ninth switch (S9), or with a second port driver (P2) for triggering of the eighth switch (S8) and triggering of the ninth switch (S9), and with a third port driver (P3) for the first switch (S1) and the fourth switch (S4).

12. Apparatus as defined in claim 4, wherein the first through fifth switches (S1 through S5), the eighth switch (S8), the ninth switch (S9), and the reference capacitance $C_{REF}$ are formed by a micro-controller with a sample-and-hold capacitor in an Analog-to-Digital converter (ADC) for $C_{REF}$ and with a channel multiplexer (MUX) before the ADC for the first switch (S1), the second switch (S2) and the fourth switch (S4) and with a first port driver (P1) for the third switch (S3) and the fifth switch (S5), and with a second port driver (P2) for the eighth switch (S8) and the ninth switch (S9).

13. Apparatus as defined in claim 5, wherein the first through fifth switches (S1 through S5), the eighth switch (S8), the ninth switch (S9), and the reference capacitance $C_{REF}$ are formed by a micro-controller with a sample-and-hold capacitor in an Analog-to-Digital converter (ADC) for $C_{REF}$ and with a channel multiplexer (MUX) before the ADC for the first switch (S1), the second switch (S2) and the fourth switch (S4) and with a first port driver (P1) for the third switch (S3) and the fifth switch (S5), and with a second port driver (P2) for the eighth switch (S8) and the ninth switch (S9).

14. Apparatus as defined in claim 5, wherein a new network node ($P_{REF}$) is formed by the connection of the first switch (S1) and of the fourth switch (S4), and an additional channel-selector switch (S0) is provided that creates the connection between the newly-established network nodes ($P_{REF}$) on the one side, and between the reference capacitance $C_{REF}$ and the second switch (S2) on the other side.

15. Apparatus as defined in claim 14, wherein the sixth switch (S6) and the seventh switch (S7) are each implemented using a MOSFET (T6, T7) with electronic triggering circuit (MOSFET triggering device) whereby the external capacitance $C_{EXT}$ represents at least one-half of the drain/source capacitors of each of the two MOSFETs (T6, T7) that is visible in the blocked condition of the MOSFETs.

16. Apparatus as defined in claim 15, wherein the first through fifth switches (S1 through S5), the eighth switch (S8), the ninth switch (S9) and the reference capacitance $C_{REF}$ are formed by a micro-controller with sample-and-hold capacitor in an analog-to-digital converter (ADC) for $C_{REF}$ and with a channel multiplexer (MUX) for the second switch (S2) and the additional channel-selector switch (S0), and with a first port driver (P1) for the third switch (S3) and the fifth switch (S5), and with a second port driver (P2) for the eighth switch (S8) and the ninth switch (S9), or with a second port driver (P2) for triggering of the eighth switch (S8) and triggering of the ninth switch (S9), and with a third port driver (P3) for the first switch (S1) and the fourth switch (S4).

\* \* \* \* \*